(12) United States Patent
Jayapalan et al.

(10) Patent No.: US 7,973,541 B2
(45) Date of Patent: Jul. 5, 2011

(54) METHOD AND APPARATUS FOR ESTIMATING RESISTANCE AND CAPACITANCE OF METAL INTERCONNECTS

(75) Inventors: Jayakannan Jayapalan, San Diego, CA (US); David Bang, La Jolla, CA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 334 days.

(21) Appl. No.: 11/951,491

(22) Filed: Dec. 6, 2007

(65) Prior Publication Data
US 2009/0146681 A1 Jun. 11, 2009

(51) Int. Cl.
G01R 27/26 (2006.01)
(52) U.S. Cl. ......... 324/678; 324/686; 324/690; 324/715
(58) Field of Classification Search .................. 324/678, 324/715
See application file for complete search history.

(56) References Cited

U.S. PATENT DOCUMENTS

| | | | |
|---|---|---|---|
| 5,006,808 A * | 4/1991 | Watts | 324/537 |
| 5,744,964 A * | 4/1998 | Sudo et al. | 324/537 |
| 5,801,394 A | 9/1998 | Isobe | |
| 6,404,222 B1 * | 6/2002 | Fan et al. | 324/765 |
| 6,528,818 B1 | 3/2003 | Satya et al. | |
| 6,819,123 B2 | 11/2004 | Marshall et al. | |
| 6,836,133 B2 | 12/2004 | Kinoshita | |
| 6,856,143 B2 * | 2/2005 | McNutt et al. | 324/658 |
| 6,876,208 B2 | 4/2005 | Kunikiyo et al. | |
| 6,894,520 B2 * | 5/2005 | Yamashita et al. | 324/765 |
| 7,026,646 B2 | 4/2006 | Cowles et al. | |
| 7,099,808 B2 * | 8/2006 | Suaya et al. | 703/4 |
| 7,230,435 B2 * | 6/2007 | Kunikiyo et al. | 324/658 |
| 7,344,899 B2 | 3/2008 | Lunde | |
| 7,487,064 B2 | 2/2009 | Lim | |
| 7,529,318 B2 * | 5/2009 | Huber | 375/316 |
| 2001/0033177 A1 * | 10/2001 | Lindolf et al. | 324/679 |

(Continued)

FOREIGN PATENT DOCUMENTS
WO WO2007093172 8/2007

OTHER PUBLICATIONS

Ajioka Y et al: "Test structure measuring inter- and intralayer coupling capacitance of interconnection with subfemtofarad resolution" IEEE Transactions on Electron Devices, IEEE Service Center, Pisacataway, NJ, US, vol. 51, No. 5, May 1, 2004, pp. 726-735, XP011113443 ISSN: 0018-9383.

(Continued)

Primary Examiner — Timothy J Dole
Assistant Examiner — John Zhu
(74) Attorney, Agent, or Firm — Donald C. Kordich (57) ABSTRACT

Techniques for estimating resistance and capacitance of metal interconnects are described. An apparatus may include an interconnect, a set of pads, a set of isolation circuits, and a test circuit. The set of pads may be coupled to the interconnect and used for simultaneously applying a current through the interconnect and measuring a voltage across the interconnect. The current and voltage may be used to estimate the resistance of the interconnect. The test circuit may charge and discharge the interconnect to estimate the capacitance of the interconnect. The isolation circuits may isolate the pads from the interconnect when the test circuit charges and discharges the interconnect. The apparatus may further include another interconnect, another set of pads, and another set of isolation circuits that may be coupled in a mirror manner. Resistance and/or capacitance mismatch between the two interconnects may be accurately estimated.

19 Claims, 9 Drawing Sheets

U.S. PATENT DOCUMENTS

2006/0220012 A1* 10/2006 Wu et al. .................. 257/48
2007/0093172 A1 4/2007 Zheng

OTHER PUBLICATIONS

Dennis Sylvester et al: "Analytical Modeling and Characterization of Deep-Submicrometer Interconnect" Proceedings of the IEEE, IEEE. New York, US, vol. 89, No. 5, May 1, 2001, XP011044509 ISSN: 0018-9219.

International Search Report and Written Opinion—PCT/US2008/085740, International Search Authority—European Patent Office—0/17/2009.

* cited by examiner

METHOD AND APPARATUS FOR ESTIMATING RESISTANCE AND CAPACITANCE OF METAL INTERCONNECTS

BACKGROUND

I. Field

The present disclosure relates generally to electronics, and more specifically to techniques for estimating resistance and capacitance of metal interconnects in an electronics circuit.

II. Background

An electronics circuit typically has many circuit blocks, each of which may be implemented with various circuit elements such as transistors, resistors, capacitors, inductors, etc. The circuit blocks may be coupled via metal interconnects, which may conduct signals exchanged between these circuit blocks. Ideally, the metal interconnects should have zero resistance and zero capacitance and should minimally affect the propagation of the signals. However, in practice, the metal interconnects are not ideal and have parasitic resistance and capacitance, which may affect signal propagation and the operation of the circuit blocks coupled by these metal interconnects. It may be desirable to be able to accurately estimate the resistance and capacitance of the metal interconnects in order to account for their effects.

SUMMARY

Techniques for estimating resistance and capacitance of interconnects are described herein. An interconnect is an electrical connection between two points or nodes. An interconnect may be formed with an etched metal line or trace, or a line of some other type of conducting material.

In one design, an apparatus (e.g., an integrated circuit) may include a first interconnect, a first set of pads, and a test circuit. The first set of pads may be coupled to the first interconnect and used for simultaneously applying a first current through the first interconnect and measuring a first voltage across the first interconnect. The first current and the first voltage may be used to estimate the resistance of the first interconnect. The test circuit may charge and discharge the first interconnect to estimate the capacitance of the first interconnect. The apparatus may further include a first set of isolation circuits located between the first set of pads and the first interconnect. The first set of isolation circuits may comprise fuses or pass gates and may be used to isolate the first set of pads from the first interconnect when the test circuit charges and discharges the first interconnect.

The apparatus may further include a second interconnect and a second set of pads coupled to the second interconnect. The second set of pads may be used for simultaneously applying a second current through the second interconnect and measuring a second voltage across the second interconnect. The second current and the second voltage may be used to estimate the resistance of the second interconnect. The test circuit may charge and discharge the first and second interconnects to estimate capacitance mismatch between the first and second interconnects. A second set of isolation circuits may be located between the second set of pads and the second interconnect. The second set of isolation circuits may be used to isolate the second set of pads from the second interconnect when the test circuit charges and discharges the second interconnect.

Various aspects and features of the disclosure are described in further detail below.

DETAILED DESCRIPTION

Metal interconnects are lines or traces used in integrated circuit (IC) dies or printed circuit boards (PCBs) to connect circuit blocks. A metal interconnect may be fabricated with any type of metal or conducting material and may have any dimension and shape. A circuit block may include any number of circuit elements. For example, in digital circuits, a circuit block may be an inverter, a buffer, a logic gate, a latch, a flip-flop, etc.

A metal interconnect inherently has parasitic resistance and capacitance, which can affect the timing and waveform of an electrical signal sent via the metal interconnect. The characteristics of metal interconnects can thus affect the operation of circuit blocks coupled by the metal interconnects.

Figure 1:
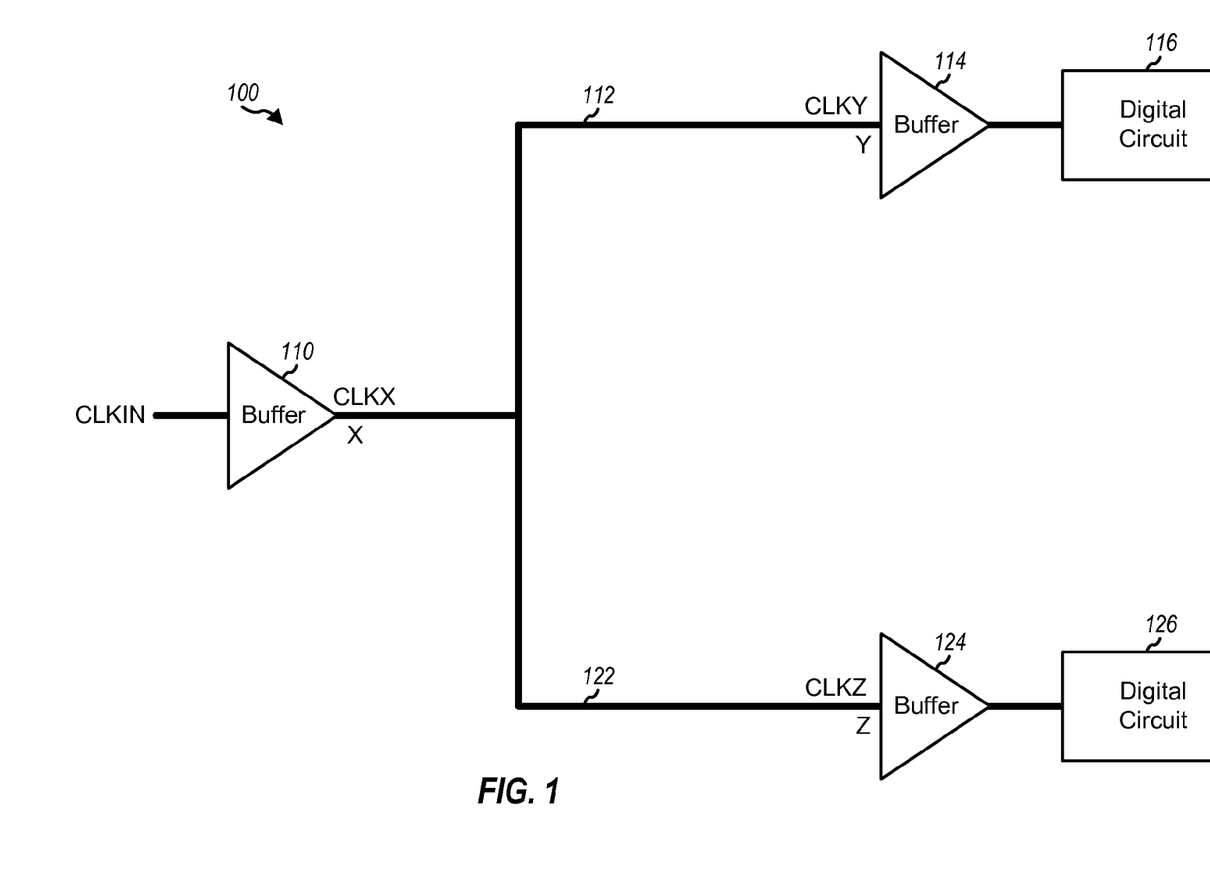
FIG. 1 shows a clock distribution network.

FIG. 1 shows a block diagram of a clock distribution network 100 with metal interconnects. Clock distribution network 100 includes buffers 110, 114 and 124 and may be fabricated on an IC die. A metal interconnect 112 couples the output of buffer 110 (point X) to the input of buffer 114 (point Y). Similarly, a metal interconnect 122 couples the output of buffer 110 to the input of buffer 124 (point Z). Buffer 110 receives an input clock signal CLKIN and drives both buffers 114 and 124 via metal interconnects 112 and 122, respectively. Buffer 114 receives its input clock signal CLKY and provides an output clock signal for a digital circuit 116. Similarly, buffer 124 receives its input clock signal CLKZ and provides an output clock signal for a digital circuit 126.

It may be desirable to have the CLKY signal be time aligned with the CLKZ signal. Metal interconnect 112 may be designed to be identical to metal interconnect 122 and may have the same dimension (e.g., length, width, and/or height) as well as the same shape (e.g., mirror image of one another). However, random variations in IC fabrication process may cause metal interconnects 112 and 122 to be different in some way. The difference may then cause a skew in the clock signals at points Y and Z.

Figure 2:
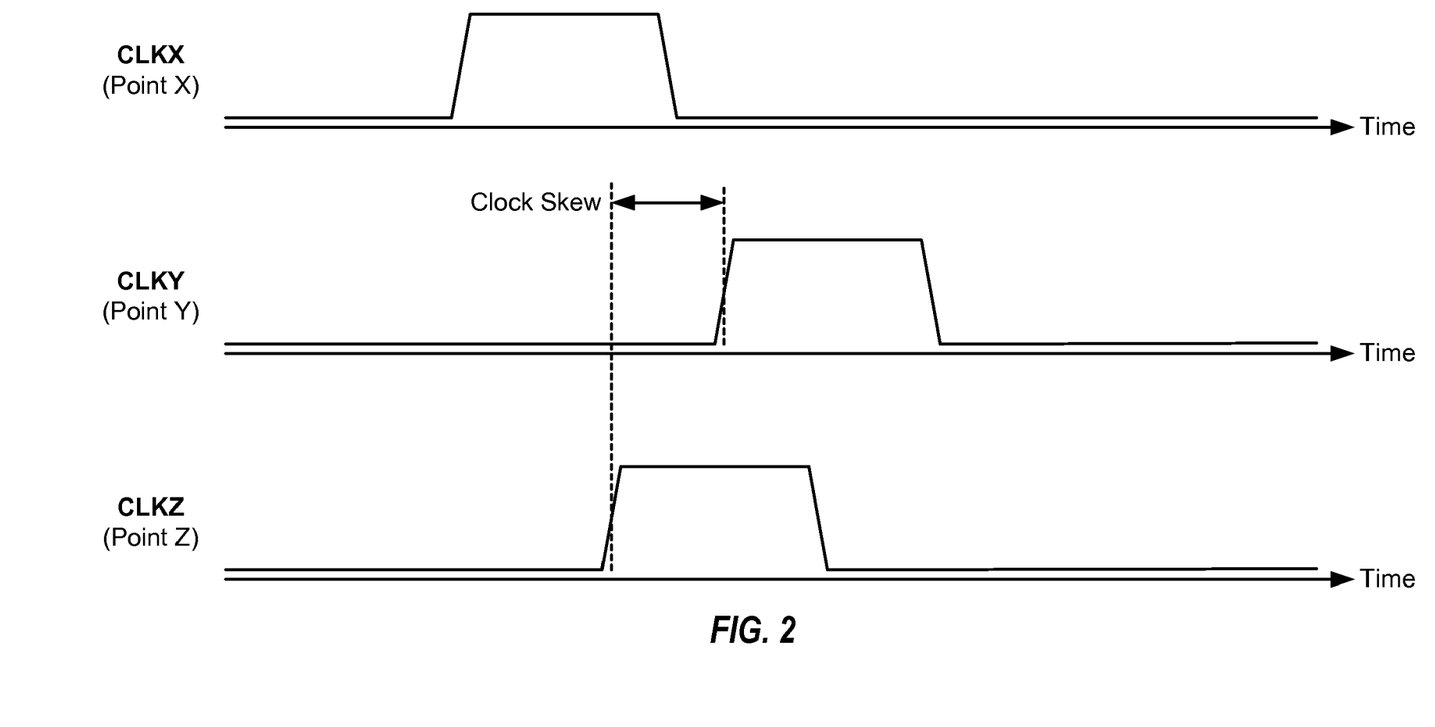
FIG. 2 shows a timing diagram of clock skew in the clock distribution network.

FIG. 2 shows a timing diagram illustrating clock skew in clock distribution network 100 in FIG. 1. The CLKX signal at the output of buffer 110 is shown at the top, the CLKY signal at the input of buffer 114 is shown in the middle, and the CLKZ signal at the input of buffer 124 is shown at the bottom. The delay between the CLKX and CLKY signals is determined by the parasitics of metal interconnect 112. The delay between the CLKX and CLKZ signals is determined by the parasitics of metal interconnect 122. Ideally, metal interconnects 112 and 122 should match exactly, and the CLKY and CLKZ signals should be time aligned.

However, differences between metal interconnects 112 and 122 due to random process variations may cause a timing skew in the CLKY and CLKZ signals. The amount of timing skew may be dependent on the extent of the differences between metal interconnects 112 and 122. In any case, the timing skew may result in digital circuit 116 activating at different time than digital circuit 126, which may adversely impact performance.

It may be desirable to be able to accurately estimate the parasitic resistance and capacitance of metal interconnects. The parasitic information may be used to assist in designing circuits, to detect for timing skews, to compensate for detected timing skews, to improve IC fabrication process, etc.

Figure 3:
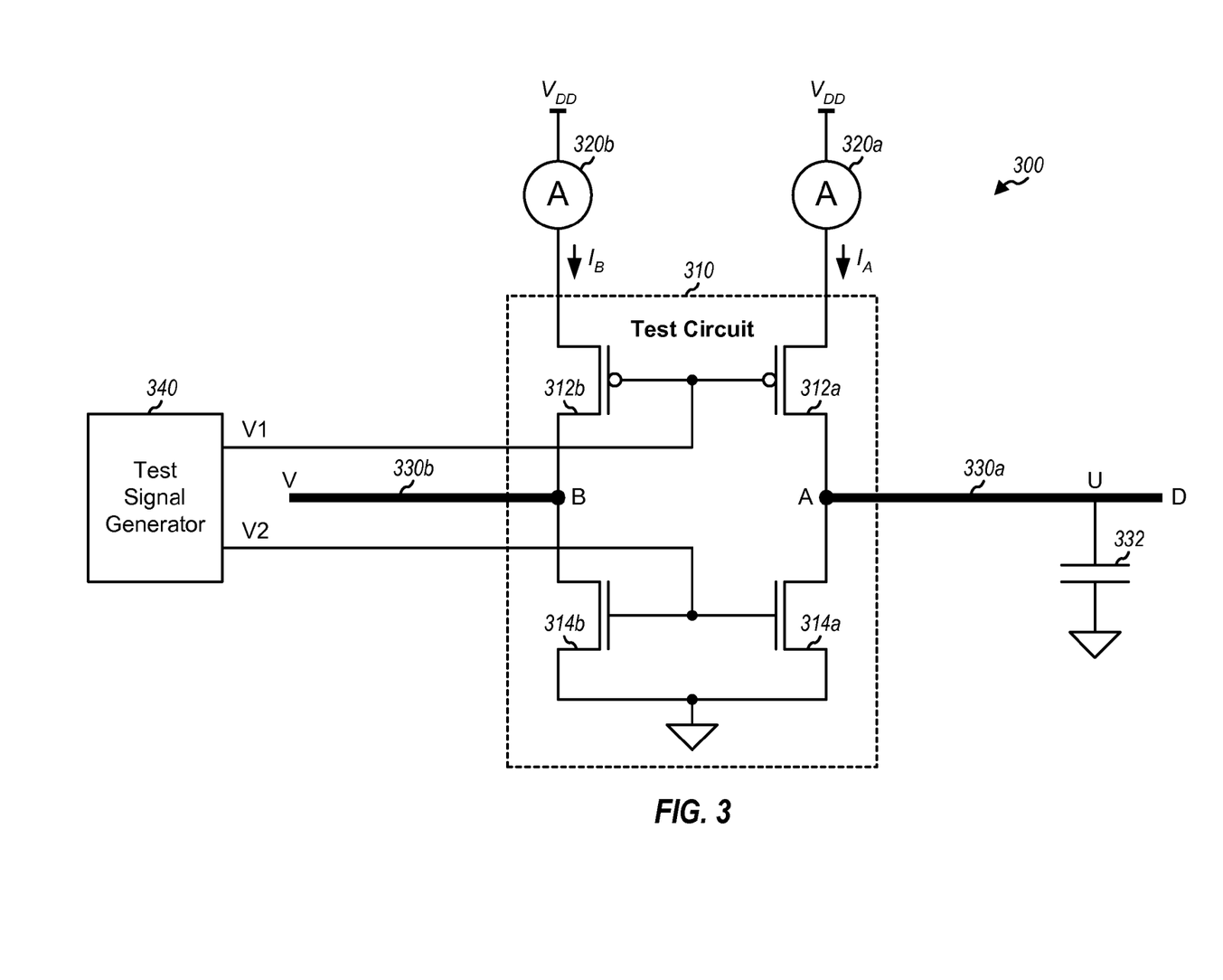
FIG. 3 shows a test configuration for estimating small capacitance.

FIG. 3 shows a schematic diagram of a test configuration 300 that may be used to accurately estimate small capacitance. Test configuration 300 utilizes charge-based capacitance measurement (CBCM), which is described in detail by D. Sylvester and C. Hu in a paper entitled "Analytical Modeling and Characterization of Deep-Submicron Interconnect," Proc. IEEE, vol. 89, pp. 634-664, May 2001, which is publicly available.

A test circuit 310 includes P-channel metal oxide semiconductor (PMOS) transistors 312a and 312b and N-channel MOS (NMOS) transistors 314a and 314b. PMOS transistors 312a and 312b have their sources coupled to ammeters 320a and 320b, respectively, their gates receiving a V1 control signal, and their drains coupled to nodes A and B, respectively. NMOS transistors 314a and 314b have their drains coupled to nodes A and B, respectively, their gates receiving a V2 control signal, and their sources coupled to circuit ground. A test signal generator 340 generates the V1 and V2 control signals. Ammeters 320a and 320b are further coupled to a supply voltage $V_{DD}$ via separate nodes.

A metal interconnect 330a runs from node A to node D. A capacitor 332, whose capacitance is to be estimated, is coupled to metal interconnect 330a at node U. A metal interconnect 330b runs from node B to node V and is matched to metal interconnect 330a from node A to node U. Thus, metal interconnects 330a and 330b are matched up to the point where capacitor 332 is connected.

Figure 4:
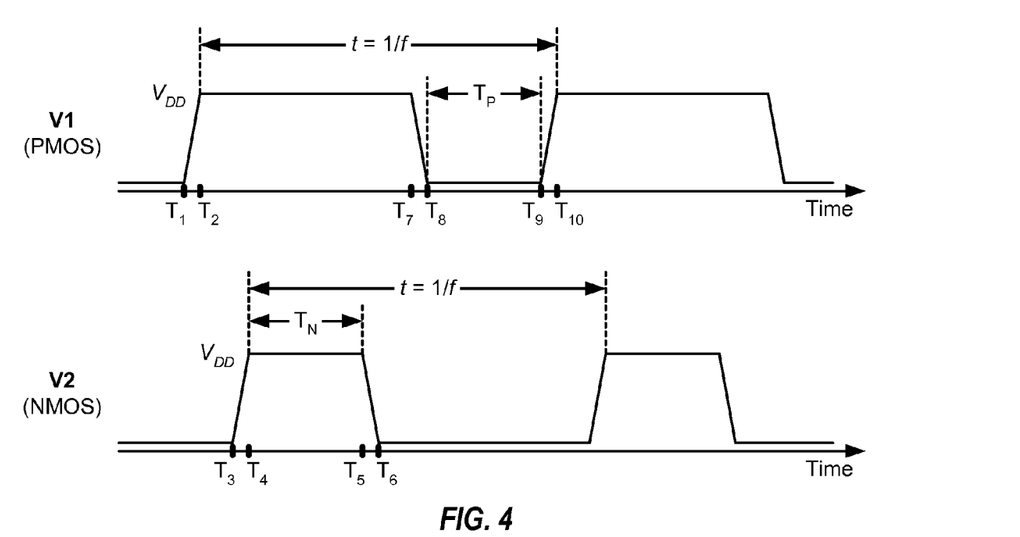
FIG. 4 shows a timing diagram of control signals for a test circuit.

FIG. 4 shows a timing diagram of the V1 and V2 control signals for test circuit 310. Both control signals have the same frequency of f but are generated such that only PMOS transistors 312 or NMOS transistors 314 in FIG. 3 are turned on at any given moment.

Test circuit 310 operates as follows. During the time interval $T_N$ from times $T_4$ to $T_5$ in FIG. 4, the V1 and V2 control signals are both at logic high, NMOS transistors 314a and 314b are turned on, and PMOS transistors 312a and 312b are turned off. The capacitances of metal interconnects 330a and 330b, capacitor 332, and transistors 312 and 314 are completely discharged via NMOS transistors 314a and 314b. During the time interval $T_P$ from times $T_8$ to $T_9$ in FIG. 4, the V1 and V2 control signals are both at logic low, NMOS transistors 314a and 314b are turned off, and PMOS transistors 312a and 312b are turned on. The capacitances of metal interconnects 330a and 330b, capacitor 332, and transistors 312 and 314 are fully charged to the supply voltage $V_{DD}$ via PMOS transistors 312a and 312b. The charging and discharging of the capacitances are repeated in each test cycle of t=1/f.

PMOS transistors 312 are completely turned off before NMOS transistors 314 are turned on. To achieve this, the V2 control signal transitions to logic high starting at time $T_3$ in FIG. 4, which occurs after the V1 control signal has reached logic high at time $T_2$. Similarly, NMOS transistors 314 are completely turned off before PMOS transistors 312 are turned on. To achieve this, the V1 control signal transitions to logic low starting at time $T_7$, which occurs after the V2 control signal has reached logic low at time $T_6$. The timing of the V1 and V2 control signals does not need to be precise. The low-to-high transition on the V2 control signal (e.g., at time $T_3$) should start after the V1 control signal has already reached logic high (e.g., at time $T_2$). The high-to-low transition on the V1 control signal (e.g., at time $T_7$) should start after the V2 control signal has already reached logic low (e.g., at time $T_6$).

The total charges in each test cycle may be expressed as:

$$Q_A = (C_A + C) \cdot V_{DD} = I_A \cdot t, \text{ and} \qquad \text{Eq (1)}$$

$$Q_B = C_B \cdot V_{DD} = I_B \cdot t, \qquad \text{Eq (2)}$$

where
$C_A$ is the parasitic capacitance associated with node A,
$C_B$ is the parasitic capacitance associated with node B,
C is the capacitance of capacitor 332,
$I_A$ and $I_B$ are the average charging currents for nodes A and B, respectively, and
$Q_A$ and $Q_B$ are the total charges for nodes A and B, respectively.

The average currents $I_A$ and $I_B$ may be accurately measured with ammeters 320a and 320b, respectively. Capacitance $C_A$ includes the capacitance of metal interconnect 330a from node A to node U and the parasitic capacitances of transistors 312a and 314b. Capacitance $C_B$ includes the capacitance of metal interconnect 330b and the parasitic capacitances of transistors 312b and 314b. Capacitance $C_B$ should be equal to capacitance $C_A$ since metal interconnects 330a and 330b are matched and the transistors are also matched.

Equations (1) and (2) may be combined, as follows:

$$I_{net} = I_A - I_B = \frac{(C_A + C - C_B) \cdot V_{DD}}{t} \approx C \cdot V_{DD} \cdot f. \qquad \text{Eq (3)}$$

Equation (3) indicates that capacitance C may be estimated based on the difference between the average currents $I_A$ and $I_B$, the supply voltage $V_{DD}$, and the frequency f. The average currents $I_A$ and $I_B$ can be measured. The supply voltage $V_{DD}$ and frequency f are known or can be determined.

Test configuration 300 can accurately estimate the capacitance of capacitor 332, which may be a very small capacitance, e.g., less than one femto Farads (fF). The accuracy of the capacitance estimate is dependent on the accuracy of the measurements for the average currents $I_A$ and $I_B$, the matching of metal interconnects 330a and 330b, and the matching of PMOS transistors 312 and NMOS transistors 314.

It may be desirable to accurately estimate both resistance and capacitance of a metal interconnect. The resistance and capacitance information may be used to better or more fully characterize the metal interconnect. Test configuration 300 can accurately estimate capacitance but is not well suited for estimating resistance.

Figure 5:
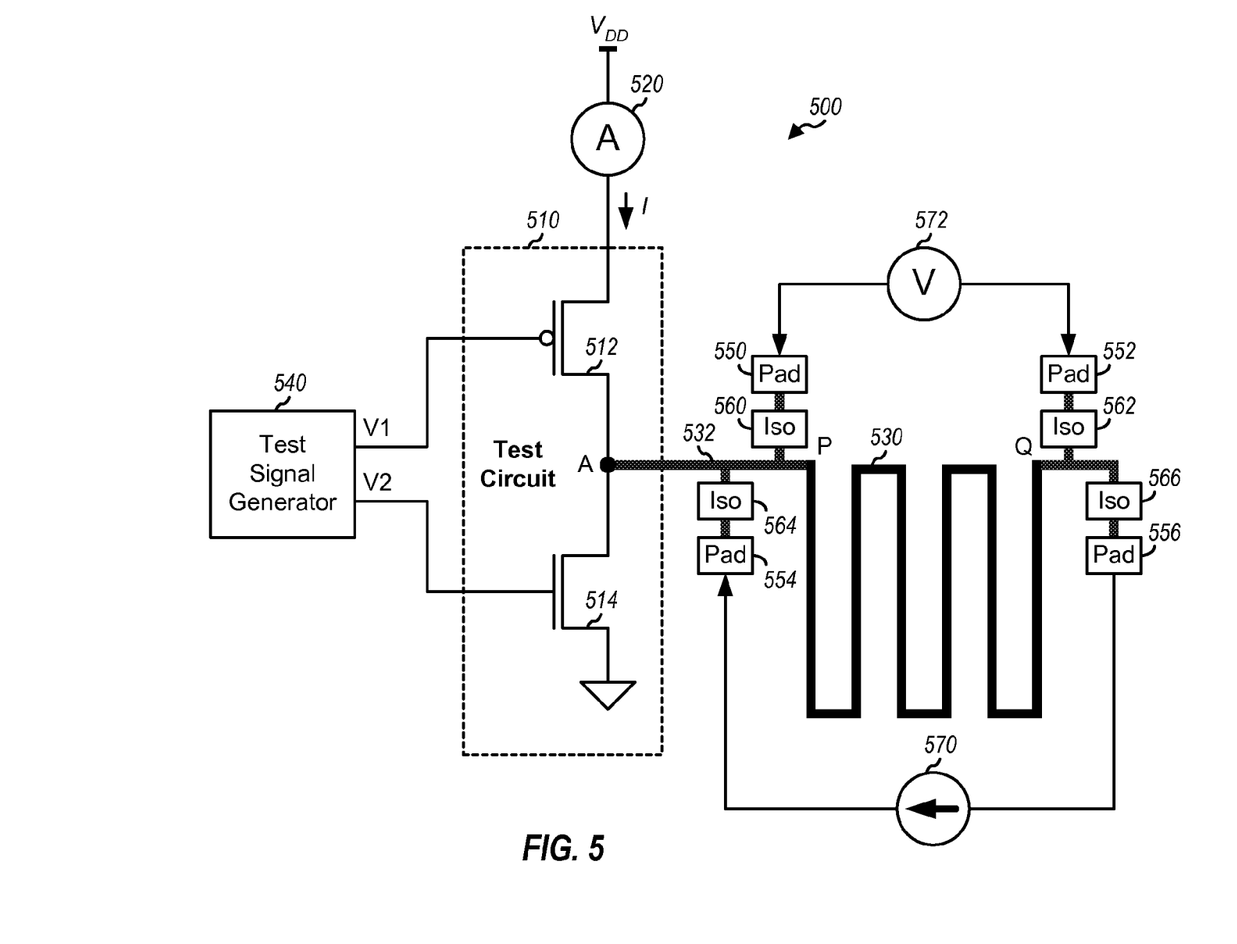
FIG. 5 shows a test configuration for estimating both resistance and capacitance.

FIG. 5 shows a schematic diagram of a test configuration 500 that may be used to accurately estimate both resistance and capacitance. A test circuit 510 includes a PMOS transistor 512 and an NMOS transistor 514. PMOS transistor 512 has its source coupled to an ammeter 520, its gate receiving a V1 control signal, and its drain coupled to node A. NMOS transistor 514 has its drain coupled to node A, its gate receiving a V2 control signal, and its source coupled to circuit ground. A test signal generator 540 generates the V1 and V2 control signals, which may be as shown in FIG. 4. Ammeter 520 is further coupled to a supply voltage $V_{DD}$.

A metal interconnect 530, whose resistance and capacitance are to be estimated, runs between nodes P and Q. In general, metal interconnect 530 may have any shape, length, dimension, structure (e.g., layout style or layer), and other attributes (e.g., distance to the closest lines), all of which may affect the resistance and capacitance characteristics of metal interconnect 530. In the example shown in FIG. 5, metal interconnect 530 has a zig-zag shape. Node A is coupled to node P via a metal line 532, which may be considered a part of metal interconnect 530.

Test pads 550 and 554 are coupled to node P via isolation (Iso) circuits 560 and 564, respectively. Test pads 552 and 556 are coupled to node Q via isolation circuits 562 and 566, respectively. Each isolation circuit may be a fuse or a pass gate. A fuse is a structure that can provide electrical connection or may be blown to provide electrical isolation. Once a fuse is blown, the effect is permanent. A pass gate may be a transistor or some other type of switch. A pass gate may be closed to provide electrical connection or opened to provide electrical isolation. Unlike a fuse, a pass gate may be closed or opened via a control signal.

The resistance of metal interconnect 530 may be accurately estimated via a Kelvin type four-point measurement. To estimate resistance, a current source 570 is applied to test pads 554 and 556 and provides a current of $I_L$ through these test pads and metal interconnect 530. A voltmeter 572 is applied to test pads 550 and 552 and measures the voltage $V_L$ across metal interconnect 530. Since a small amount of current is used by voltmeter 572 to measure voltage, the current $I_L$ from current source 570 should be large relative to the current siphoned by voltmeter 572 in order to reduce the effect of voltmeter 572 on the accuracy of the resistance estimate. Voltmeter 572 may be applied to the test pads closest to nodes P and Q to improve the accuracy of the voltage measurement across metal interconnect 530.

The resistance $R_L$ of metal interconnect 530 may be estimated as follows:

$$R_L = \frac{V_L}{I_L}. \qquad \text{Eq (4)}$$

The current $I_L$ may be accurately set for current source 570, and the voltage $V_L$ may be accurately measured by voltmeter 572. The resistance $R_L$ of metal interconnect 530 may then be accurately estimated based on accurate values of the voltage $V_L$ and the current $I_L$.

Test pads 550 through 556 are used for the four-point measurement to accurately estimate the resistance of metal interconnect 530. The parasitic capacitances of these test pads may be large in comparison to the capacitance of metal interconnect 530, which is to be estimated. It may thus be desirable to isolate the test pads and remove their parasitic capacitances when making measurements to estimate the capacitance of metal interconnect 530. This may be achieved by using isolation circuits 560 through 566 to isolate the test pads.

To estimate the capacitance of metal interconnect 530, the four test pads 550 through 556 may first be isolated, e.g., by blowing fuses or opening pass gates for the four associated isolation circuits 560 through 566. Signal generator 540 may then generate the V1 and V2 control signals, e.g., as shown in FIG. 4. Ammeter 520 may measure the average current I used to fully charge the capacitance $C_L$ of metal interconnect 530 and parasitic capacitance $C_P$ associated with node A to the supply voltage $V_{DD}$ via PMOS transistor 512.

The average current I may be expressed as:

$$I = (C_L + C_P) \cdot V_{DD} \cdot f. \qquad \text{Eq (5)}$$

Equation (5) indicates that the average current I is dependent on the capacitances $C_L$ and $C_P$ being charged as well as the supply voltage $V_{DD}$ and the frequency f. Measurements of average current may be made for different supply voltages and/or different frequencies to improve accuracy.

Figure 6:
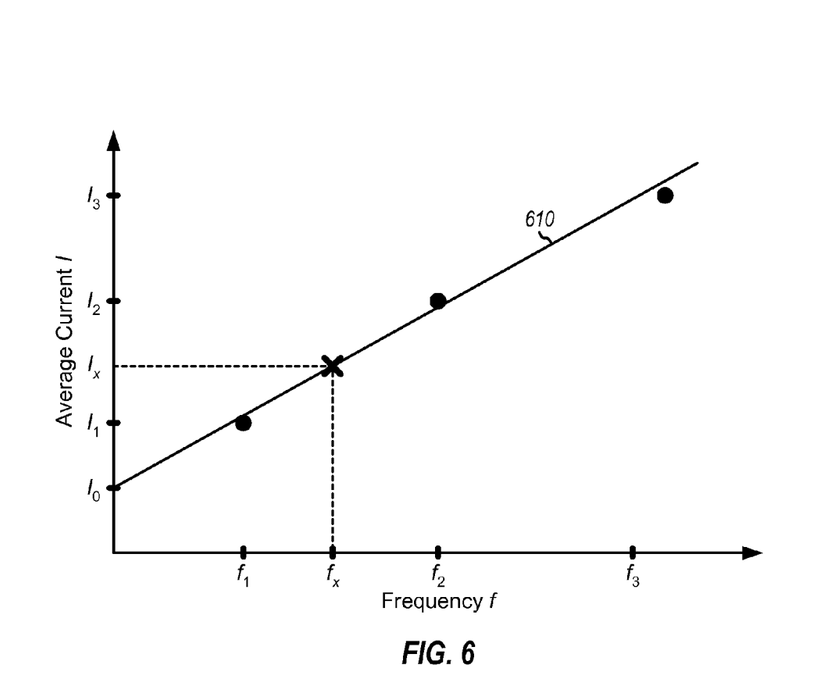
FIG. 6 shows a plot of average current versus frequency.

FIG. 6 shows a plot of average current I versus frequency f for test configuration 500 in FIG. 5. Measurements may be made at three different frequencies of $f_1$, $f_2$ and $f_3$ to obtain average currents of $I_1$, $I_2$ and $I_3$, respectively. These measurements may be plotted on a graph of average current versus frequency. A best fit straight line 610 for the three data points may be determined and drawn in the plot. Line 610 intersects the vertical axis (which corresponds to DC or f=0) at a current of $I_0$. $I_0$ is a parasitic leakage current that may include dielectric leakage across the trace for metal interconnect 530 and junction leakage of PMOS transistor 512 and NMOS transistor 514 at node A.

The capacitance of metal interconnect 530 may be estimated based on line 610, as follows:

$$C_L + C_P = \frac{I_x - I_0}{V_{DD} \cdot f_x} \approx C_L, \qquad \text{Eq (6)}$$

where $I_x$ and $f_x$ may correspond to any point on line 610. The capacitance $C_L$ of metal interconnect 530 may be much larger than the parasitic capacitance $C_P$. The capacitance $C_L$ of metal interconnect 530 may thus be accurately estimated based on line 610.

FIG. 6 shows a plot of average current I versus frequency f. A similar plot may be obtained for average current I versus supply voltage $V_{DD}$ for a specific frequency. A best fit straight line may be drawn based on the available data points and used to estimate the capacitance $C_L$ of metal interconnect 530.

Figure 7:
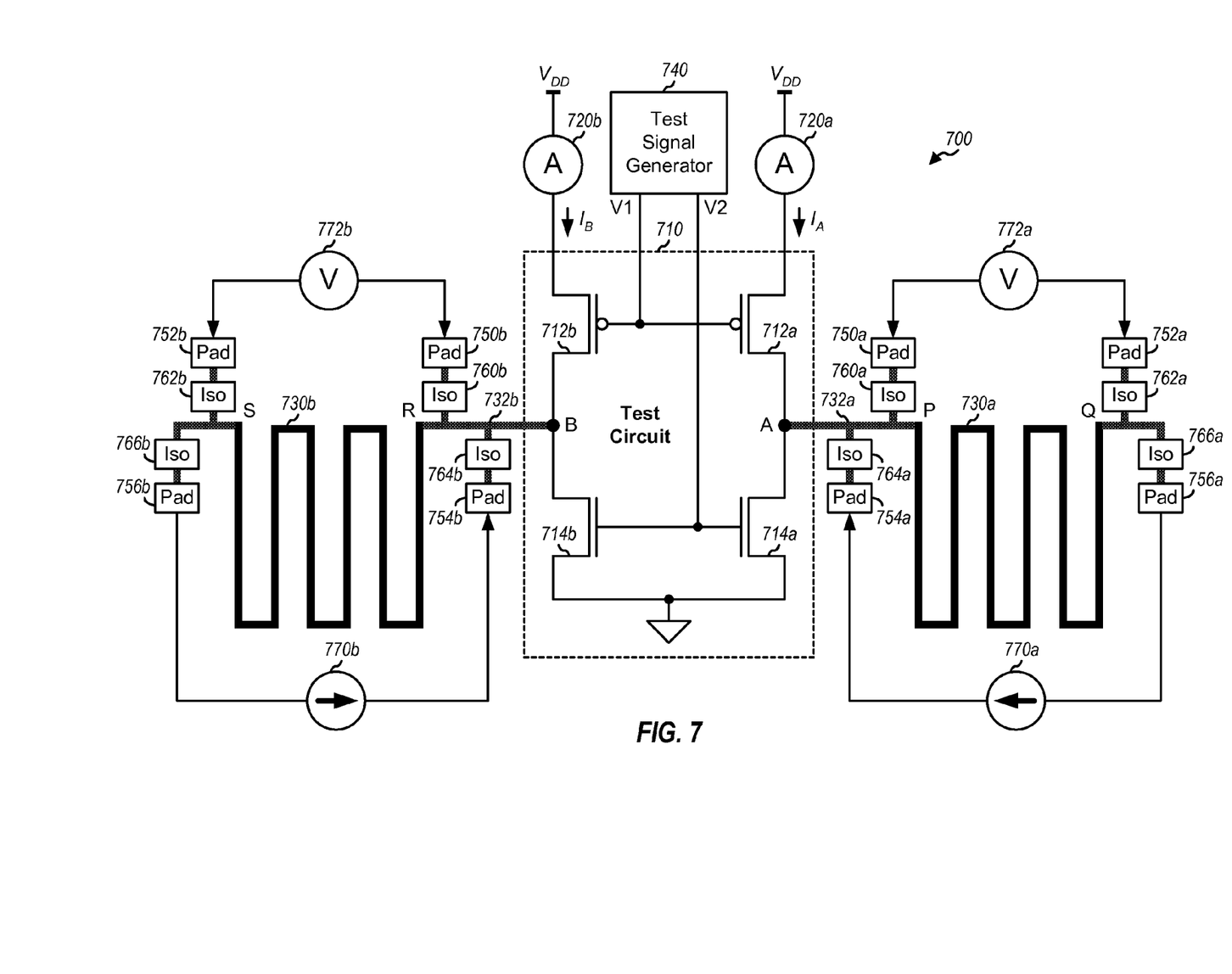
FIG. 7 shows a test configuration for estimating both resistance and capacitance mismatches between two metal interconnects.

FIG. 7 shows a schematic diagram of a test configuration 700 that may be used to accurately estimate both resistance and capacitance mismatches in two metal interconnects. A test circuit 710 includes PMOS transistor 712a and 712b and NMOS transistors 714a and 714b, which are coupled as described above for FIG. 3. A test signal generator 740 generates the V1 and V2 control signals, e.g., as shown in FIG. 4. Ammeters 720a and 720b are coupled to the sources of PMOS transistors 712a and 712b, respectively, and also to a supply voltage $V_{DD}$ via separate nodes.

A metal interconnect 730a runs between nodes P and Q, with node P being coupled to node A via a metal line 732a. Test pads 750a and 754a are coupled to node P via isolation circuits 760a and 764a, respectively. Test pads 752a and 756a are coupled to node Q via isolation circuits 762a and 766a, respectively. Similarly, a metal interconnect 730b runs between nodes R and S, with node R being coupled to node B via a metal line 732b. Test pads 750b and 754b are coupled to node R via isolation circuits 760b and 764b, respectively. Test pads 752b and 756b are coupled to node S via isolation circuits 762b and 766b, respectively. Each isolation circuit may be a fuse or a pass gate. Metal interconnect 730b may be matched to metal interconnect 730a.

The resistance of metal interconnect 730a may be accurately estimated with a four-point measurement. For this measurement, a current source 770a may provide a current of $I_{LA}$ through test pads 754a and 756a and metal interconnect 730a, and a voltmeter 772a may measure the voltage $V_{LA}$ across metal interconnect 730a at test pads 750a and 752a. The resistance $R_{LA}$ of metal interconnect 730a may then be estimated based on the current $I_{LA}$ and the voltage $V_{LA}$, as shown in equation (4). The resistance of metal interconnect 730b may be accurately estimated in similar manner. A current source 770b may provide a current of $I_{LB}$ through test pads 754b and 756b and metal interconnect 730b, and a voltmeter 772b may measure the voltage $V_{LB}$ across metal interconnect 730b at test pads 750b and 752b. The resistance $R_{LB}$ of metal interconnect 730b may then be estimated based on the current $I_{LB}$ and the voltage $V_{LB}$. The resistance mismatch may be computed as the difference between resistances $R_{LA}$ and $R_{LB}$.

To estimate capacitance mismatch of metal interconnects 730a and 730b, the eight test pads 750a through 756b may first be isolated, e.g., by blowing fuses or opening pass gates for the eight associated isolation circuits 760a through 766b. Signal generator 740 may then generate the V1 and V2 control signals, e.g., as shown in FIG. 4. Ammeter 720a may measure the average current $I_A$ used to fully charge the capacitance $C_{LA}$ of metal interconnect 730a and parasitic capacitance $C_{PA}$ associated with node A to the supply voltage $V_{DD}$ via PMOS transistor 712a. Ammeter 720b may measure the average current $I_B$ used to fully charge the capacitance $C_{LB}$ of metal interconnect 730b and parasitic capacitance $C_{PB}$ associated with node B to the supply voltage $V_{DD}$ via PMOS transistor 712b.

The difference between the average currents $I_A$ and $I_B$ may be expressed as:

$$I_{net} = I_A - I_B \quad \text{Eq (7)}$$
$$= \frac{(C_{LA} + C_{PA} - C_{LB} - C_{PB}) \cdot V_{DD}}{t}$$
$$\approx (C_{LA} - C_{LB}) \cdot V_{DD} \cdot f.$$

Equation (7) indicates that the capacitance mismatch $C_{LA}-C_{LB}$ may be estimated based on the difference between the average currents $I_A$ and $I_B$, the supply voltage $V_{DD}$, and the frequency f. The average currents $I_A$ and $I_B$ can be accurately measured. The supply voltage $V_{DD}$ and frequency f are known or can be accurately determined. The capacitance mismatch may be accurately estimated because (i) parasitic capacitance $C_{PB}$ should be approximately equal to parasitic capacitance $C_{PA}$ since the line structures at nodes A and B are matched and the transistors in test circuit 710 are also matched and/or (ii) the capacitances $C_{LA}$ and $C_{LB}$ are much larger than the parasitic capacitances $C_{PA}$ and $C_{PB}$, respectively.

The capacitance $C_{LA}$ of metal interconnect 730a may be estimated, e.g., as described above for FIG. 5. The capacitance $C_{LB}$ of metal interconnect 730b may also be estimated in similar manner.

Resistance may be dependent on temperature whereas capacitance may not be dependent on temperature. If the isolation circuits are implemented with fuses, then the resistance of each metal interconnect may be measured for different temperatures prior to blowing the fuses for making capacitance measurements.

FIG. 5 shows an example test configuration 500 that may be used to estimate resistance and capacitance of metal interconnect 530. FIG. 7 shows an example test configuration 700 that may be used to estimate resistance and capacitance mismatches of metal interconnects 730a and 730b. Other test configurations may also be designed and used to estimate resistance, capacitance, and mismatches. For example, the number of test pads may be reduced by sharing pads.

Test configuration 500 and/or 700 may be implemented on IC dies and used to characterize variations in IC fabrication process. In particular, random process variations in backend, which refers to the interconnection and metallization steps of the IC fabrication process, may be measured based on the test configurations described herein. The resistance and capacitance measurements may be used to derive accurate backend statistical mismatch models, which may then be used in the circuit design phase. For example, the accurate statistical mismatch models may be used to improve the design of clock distribution networks. Typically, a conservative estimate of mismatch may be obtained and additional margins may be added to obtain a total mismatch estimate. An upper limit on how far buffers 114 and 124 can be placed from buffer 114 may then be determined by the total mismatch estimate. If the mismatch can be more accurately estimated, then a smaller margin may be used, and buffers 114 and 124 may be placed farther from buffer 114.

Accurate estimation of resistance and capacitance may also be used to improve IC fabrication process. Some parameters such as effective resistivity, metal grain size, and barrier thickness variation may be dependent on only resistance. Some other parameters such as contamination of dielectric may be dependent on only capacitance. Specific parts of the IC fabrication process may be improved based on the accurate resistance and capacitance estimates.

The current sources, ammeters, and voltmeters in FIGS. 5 and 7 may be external test equipments used to make measurements to estimate the resistance and capacitance of metal interconnects, which may be fabricated on an IC die or a PCB. The current sources, ammeters, and/or voltmeters (or their equivalent functions) may also be implemented with circuits that may be implemented along with the test configurations.

Figure 8:
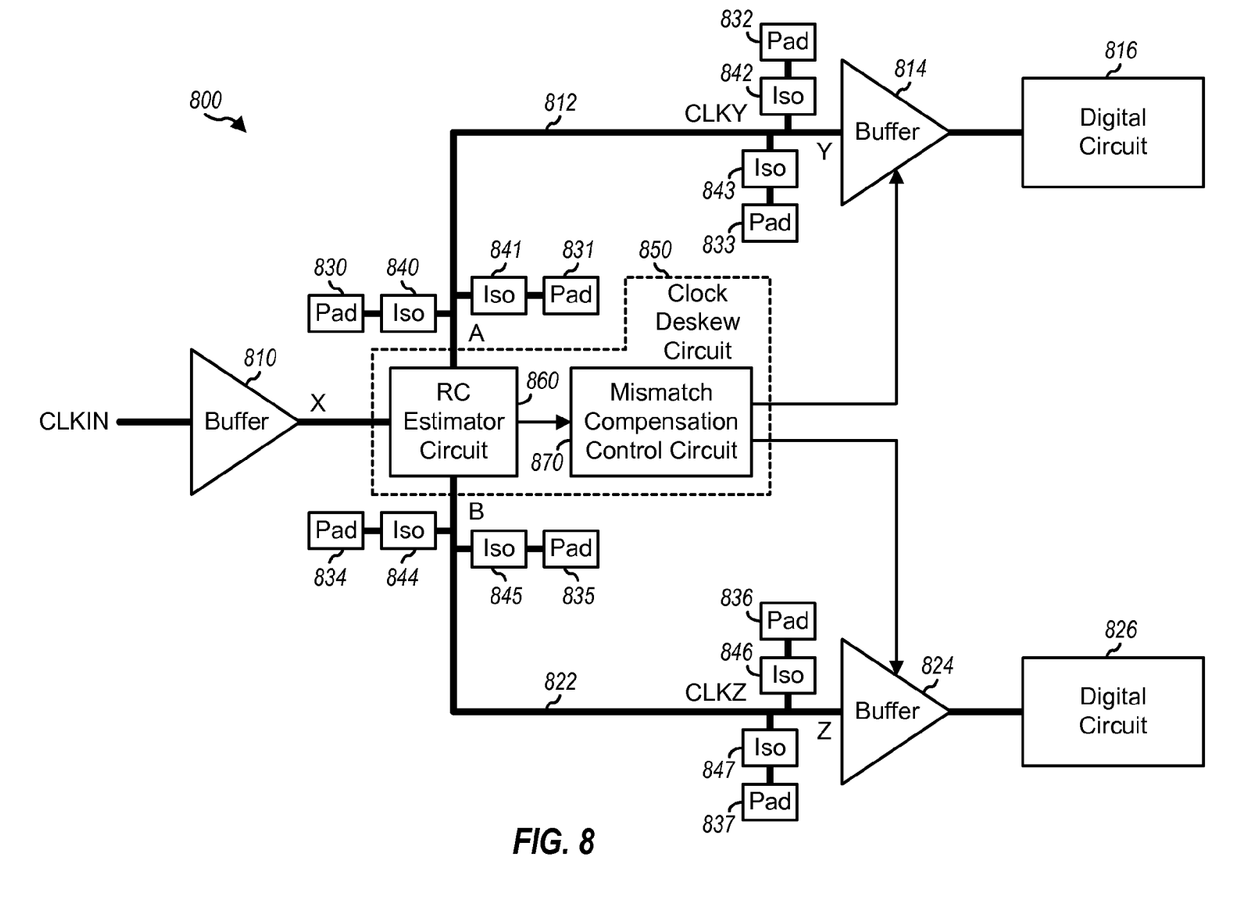
FIG. 8 shows a clock distribution network with a clock deskew circuit.

FIG. 8 shows a block diagram of a clock distribution network 800 with a clock deskew circuit 850. Clock distribution network 800 includes buffers 810, 814 and 824, metal interconnects 812 and 822, and digital circuits 816 and 826, which are coupled as described above for buffers 110, 114 and 124, metal interconnects 112 and 122, and digital circuits 116 and 126, respectively, in FIG. 1.

Test pads 830 and 831 are coupled via isolation circuits 840 and 841, respectively, to node A of clock deskew circuit 850. Test pads 832 and 833 are coupled via isolation circuits 842 and 843, respectively, to node Y at the input of buffer 814. Test pads 834 and 835 are coupled via isolation circuits 844 and 845, respectively, to node B of clock deskew circuit 850. Test pads 836 and 837 are coupled via isolation circuits 846 and 847, respectively, to node Z at the input of buffer 824. Each isolation circuit may be a fuse or a pass gate.

Test pads 830 through 833 may be used to estimate the resistance of metal interconnect 812 via a four-point measurement, as described above for FIG. 5. Similarly, test pads 834 through 837 may be used to estimate the resistance of metal interconnect 822 via a four-point measurement. Resistance estimates and/or resistance mismatch estimate for metal interconnects 812 and 822 may be provided to clock deskew circuit 850. Isolation circuits 840 through 847 may couple test pads 830 through 837 to metal interconnects 812 and 822 for resistance measurements and may isolate the test pads from the metal interconnects for capacitance measurements.

Clock deskew circuit 850 may dynamically estimate mismatch between metal interconnects 812 and 822 resulting from random process variations and may compensate for clock skew resulting from the mismatch. In the design shown in FIG. 8, clock deskew circuit 850 includes a resistance and capacitance (RC) estimator circuit 860 and a mismatch compensation control circuit 870. Estimator circuit 860 may estimate the resistance and/or capacitance of metal interconnect 812, the resistance and/or capacitance of metal interconnect 822, the resistance mismatch between metal interconnects 812 and 822, the capacitance mismatch between metal interconnects 812 and 822, etc. Estimator circuit 860 may provide resistance and/or capacitance information to control circuit 870. Control circuit 870 may adjust the operation of buffer 814 and/or buffer 824 such that the CLKY signal at point Y is time aligned with the CLKZ signal at point Z.

Figure 9:
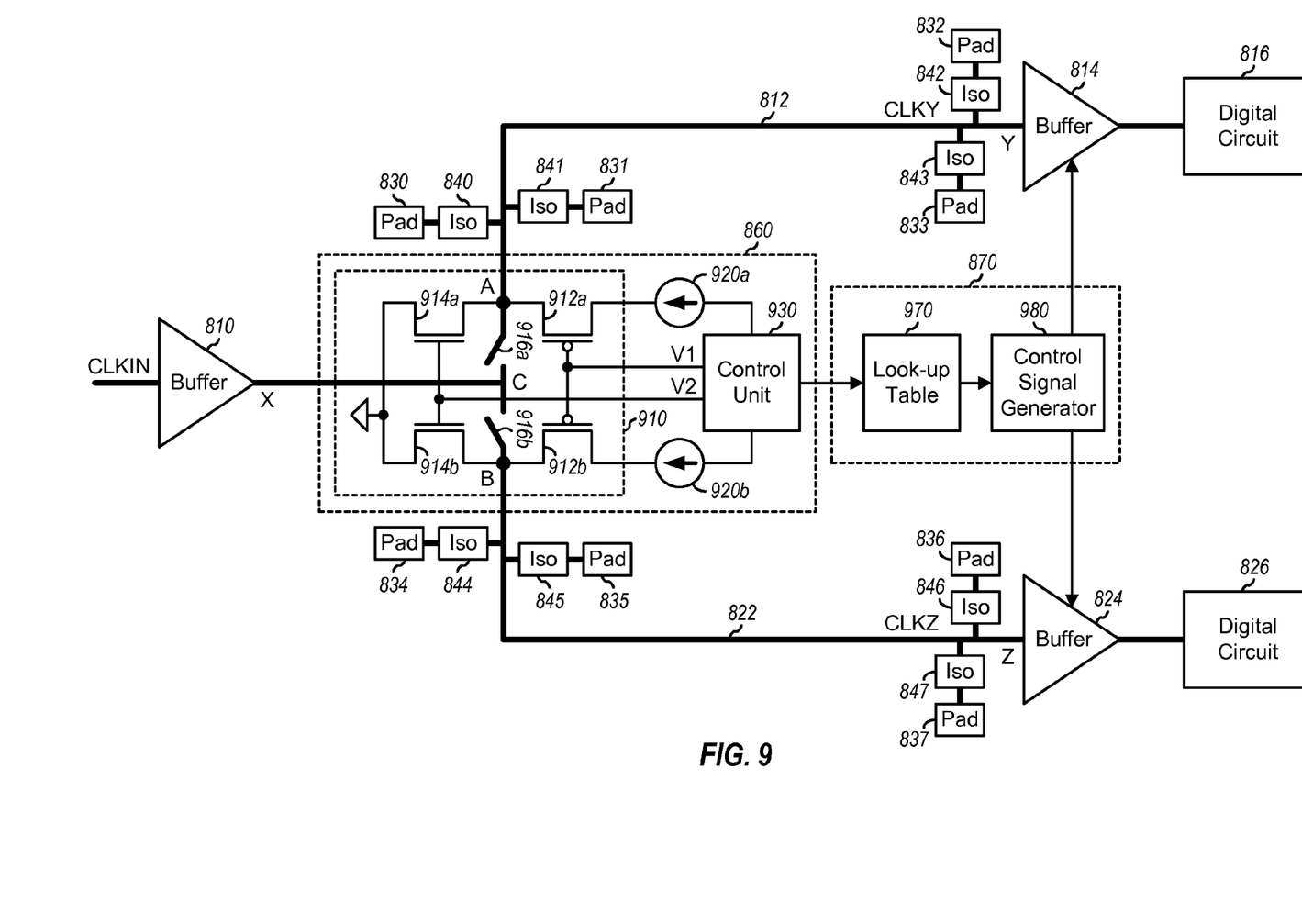
FIG. 9 shows an RC estimator circuit and a control circuit.

FIG. 9 shows a schematic diagram of a design of RC estimator circuit 860 and control circuit 870 within clock deskew circuit 850 in FIG. 8. In this design, RC estimator circuit 860 includes a test circuit 910, current sources 920a and 920b, and a control unit 930 that are coupled in similar manner as test circuit 710, ammeters 720a and 720b, and test signal generator 740, respectively, in FIG. 7.

Test circuit 910 includes PMOS transistors 912a and 912b and NMOS transistors 914a and 914b, which are coupled as described above for FIG. 7. Test circuit 910 further includes a switch 916a coupled between nodes A and C and a switch 916b coupled between nodes B and C. Switches 916a and 916b may be opened when making measurements for resistance or capacitance and may be closed during normal operation. Switches 916a and 916b may be designed to have small loss during normal operation.

Control unit 930 may generate the V1 and V2 control signals, e.g., as shown in FIG. 4, based on a reference clock signal (not shown in FIG. 9). Control unit 930 may also receive the currents from current sources 920a and 920b and provide information on capacitance or capacitance mismatch for metal interconnects 812 and 822. If the supply voltage $V_{DD}$ and frequency f are known, then the difference between the average currents from current sources 920a and 920b is proportional to the capacitance mismatch.

In the design shown in FIG. 9, control circuit 870 includes a look-up table 970 and a control signal generator 980. Look-up table 970 may receive the capacitance information from control unit 930 and resistance information, which may be determined at the start of operation or dynamically during operation. Look-up table 970 may provide control information based on the resistance and capacitance information. Generator 980 may generate appropriate control signals for buffer 814 and/or 824 to time align the CLKY and CLKZ signals. For example, the control signal for buffer 814 may increase the buffer strength if metal interconnect 812 has higher resistance and/or capacitance than those of metal interconnect 822, and vice versa. The amount of adjustment for buffer 814 or 824 may be dependent on the amount of mismatch between metal interconnects 812 and 822.

FIGS. 8 and 9 show an example application of the techniques described herein for a clock distribution network. The techniques may also be used to estimate capacitance, resistance and/or mismatches of metal interconnects for other applications.

Figure 10:
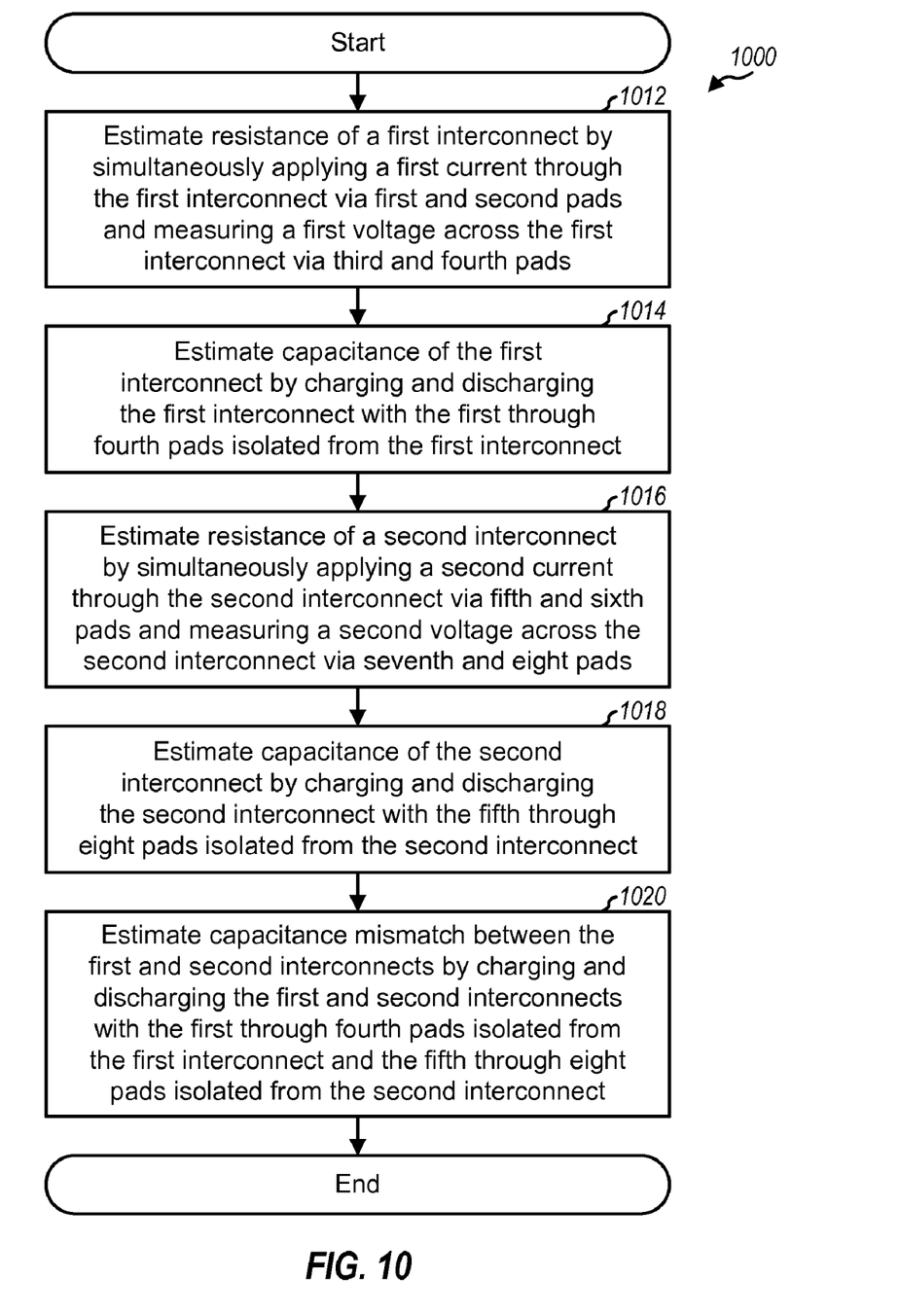
FIG. 10 shows a process for estimating resistance and capacitance.

FIG. 10 shows a design of a process 1000 for estimating resistance and capacitance. Resistance of a first interconnect may be estimated by simultaneously applying a first current through the first interconnect via first and second pads and measuring a first voltage across the first interconnect via third and fourth pads (block 1012). Capacitance of the first interconnect may be estimated by charging and discharging the first interconnect with the first through fourth pads isolated from the first interconnect (block 1014).

Resistance of a second interconnect may be estimated by simultaneously applying a second current through the second interconnect via fifth and sixth pads and measuring a second voltage across the second interconnect via seventh and eight pads (block 1016). Capacitance of the second interconnect may be estimated by charging and discharging the second interconnect with the fifth through eight pads isolated from the second interconnect (block 1018). The first and second interconnects may be charged with first and second transistors, respectively, based on a first control signal and may be discharged with third and fourth transistors, respectively, based on a second control signal.

Additionally or alternatively, capacitance mismatch between the first and second interconnects may be estimated by charging and discharging the first and second interconnects with the first through fourth pads isolated from the first interconnect and the fifth through eight pads isolated from the second interconnect (block 1020). For block 1020, the difference between first and second average currents for charging the first and second interconnects, respectively, may be determined. The frequency at which the first and second interconnects are charged and discharged may also be determined. The capacitance mismatch between the first and second interconnects may then be estimated based on the difference between first and second average currents and the frequency, e.g., as shown in equation (7).

The test configurations described herein may be implemented on an IC, an radio frequency IC (RFIC), a mixed-signal IC, an application specific integrated circuit (ASIC), a PCB, an electronics device, etc. The test configurations may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing a test configuration described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:
1. An apparatus comprising:
  a first interconnect;
  a first set of pads coupled to the first interconnect and used for simultaneously applying a first current through the first interconnect and measuring a first voltage across the first interconnect, the first current and the first voltage being used to estimate resistance of the first interconnect;
  a first set of isolation circuits located between the first set of pads and the first interconnect;
  a test circuit configured to charge and discharge the first interconnect to estimate capacitance of the first interconnect, wherein the first set of isolation circuits electrically isolate the first set of pads from the first interconnect when the test circuit charges and discharges the first interconnect to estimate the capacitance of the first interconnect;

a second interconnect, wherein the test circuit is configured to charge and discharge the first and second interconnects to estimate capacitance mismatch between the first and second interconnects; and a mismatch compensation control circuit to compensate for clock skew based on the capacitance mismatch.

2. The apparatus of claim 1, wherein the first set of pads comprises
a first pad coupled to a first end of the first interconnect,
a second pad coupled to a second end of the first interconnect, the first and second pads being used to measure the first voltage across the first interconnect,
a third pad coupled to the first end of the first interconnect, and
a fourth pad coupled to the second end of the first interconnect, the third and fourth pads being used to apply the first current through the first interconnect.

3. The apparatus of claim 1, wherein the first set of isolation circuits comprise fuses or pass gates.

4. The apparatus of claim 1, wherein the test circuit comprises
a first transistor configured to charge the first interconnect based on a first control signal, and
a second transistor coupled to the first transistor and configured to discharge the first interconnect based on a second control signal.

5. The apparatus of claim 4, wherein the first control signal fully turns off the first transistor prior to the second control signal turning on the second transistor, and wherein the second control signal fully turns off the second transistor prior to the first control signal turning on the first transistor.

6. The apparatus of claim 4, wherein the first transistor is a P-channel metal oxide semiconductor (PMOS) transistor and the second transistor is an N-channel MOS (NMOS) transistor.

7. The apparatus of claim 1, further comprising:
a second set of pads coupled to the second interconnect and used for simultaneously applying a second current through the second interconnect and measuring a second voltage across the second interconnect, the second current and the second voltage being used to estimate resistance of the second interconnect.

8. The apparatus of claim 7, wherein the first set of pads comprises:
first and second pads coupled to a first end of the first interconnect,
third and fourth pads coupled to a second end of the first interconnect, the first and third pads being used to apply the first current through the first interconnect, and the second and fourth pads being used to measure the first voltage across the first interconnect; and
wherein the second set of pads comprises:
fifth and sixth pads coupled to a first end of the second interconnect, and
seventh and eighth pads coupled to a second end of the second interconnect, the fifth and seventh pads being used to apply the second current through the second interconnect, and the sixth and eight pads being used to measure the second voltage across the second interconnect.

9. The apparatus of claim 8, further comprising:
a second set of isolation circuits located between the second set of pads and the second interconnect, the first set of isolation circuits isolating the first set of pads from the first interconnect and the second set of isolation circuits isolating the second set of pads from the second interconnect when the test circuit charges and discharges the first and second interconnects to estimate the capacitance mismatch between the first and second interconnects.

10. The apparatus of claim 7, wherein the test circuit comprises
first and second transistors configured to charge the first and second interconnects, respectively, based on a first control signal, and
third and fourth transistors coupled to the first and second transistors, respectively, and configured to discharge the first and second interconnects, respectively, based on a second control signal.

11. An integrated circuit comprising:
a first interconnect;
a first set of pads coupled to the first interconnect and used for simultaneously applying a first current through the first interconnect and measuring a first voltage across the first interconnect, the first current and the first voltage being used to estimate resistance of the first interconnect;
a first set of isolation circuits located between the first set of pads and the first interconnect;
a test circuit configured to charge and discharge the first interconnect to estimate capacitance of the first interconnect, wherein the first set of isolation circuits electrically isolate the first set of pads from the first interconnect when the test circuit charges and discharges the first interconnect to estimate the capacitance of the first interconnect;
a second interconnect, wherein the test circuit is configured to charge and discharge the first and second interconnects to estimate capacitance mismatch between the first and second interconnects; and
a mismatch compensation control circuit to compensate for clock skew based on the capacitance mismatch.

12. The integrated circuit of claim 11, further comprising:
a second set of pads coupled to the second interconnect and used for simultaneously applying a second current through the second interconnect and measuring a second voltage across the second interconnect, the second current and the second voltage being used to estimate resistance of the second interconnect; and
a second set of isolation circuits located between the second set of pads and the second interconnect,
wherein the second set of isolation circuits electrically isolate the second set of pads from the second interconnect when the test circuit charges and discharges the second interconnect to estimate the capacitance of the second interconnect.

13. A method comprising:
estimating resistance of a first interconnect by simultaneously applying a first current through the first interconnect via first and second pads and measuring a first voltage across the first interconnect via third and fourth pads;
electrically isolating the first through fourth pads from the first interconnect with a first set of isolation circuits located between the first through fourth pads from the first interconnect;
estimating capacitance of the first interconnect by charging and discharging the first interconnect with the first through fourth pads electrically isolated by the first set of isolation circuits from the first interconnect;

estimating capacitance mismatch between the first interconnect and a second interconnect by charging and discharging the first and second interconnects; and compensating for clock skew based on the capacitance mismatch.

14. The method of claim 13, wherein the estimating the capacitance of the first interconnect or the capacitance mismatch between the first and second interconnects comprises charging the first interconnect with a first transistor based on a first control signal, and discharging the first interconnect with a second transistor based on a second control signal.

15. The method of claim 13, further comprising:

estimating resistance of the second interconnect by simultaneously applying a second current through the second interconnect via fifth and sixth pads and measuring a second voltage across the second interconnect via seventh and eight pads, electrically isolating the fifth through eighth pads from the second interconnect with a second set of isolation circuits located between the fifth through eighth pads from the second interconnect, and wherein the estimating the capacitance of the first interconnect or the capacitance mismatch between the first and second interconnects comprises estimating the capacitance mismatch between the first and second interconnects by charging and discharging the first and second interconnects with the first through fourth pads electrically isolated by the first set of isolation circuits from the first interconnect and the fifth through eight pads electrically isolated by the second set of isolation circuits from the second interconnect.

16. The method of claim 15, wherein the estimating the capacitance mismatch between the first and second interconnects comprises determining difference between first and second average currents for charging the first and second interconnects, respectively, determining frequency at which the first and second interconnects are charged and discharged, and estimating the capacitance mismatch between the first and second interconnects based on the difference between the first and second average currents and the frequency.

17. An apparatus comprising:

means for estimating resistance of a first interconnect by simultaneously applying a first current through the first interconnect via first and second pads and measuring a first voltage across the first interconnect via third and fourth pads;

means for electrically isolating the first through fourth pads from the first interconnect with a first set of isolation means located between the first through fourth pads from the first interconnect;

means for estimating capacitance of the first interconnect by charging and discharging the first interconnect with the first through fourth pads electrically isolated by the first set of isolation means from the first interconnect;

means for estimating capacitance mismatch between the first interconnect and a second interconnect by charging and discharging the first and second interconnects; and means for compensating for clock skew based on the capacitance mismatch.

18. The apparatus of claim 17, further comprising:

means for estimating resistance of the second interconnect by simultaneously applying a second current through the second interconnect via fifth and sixth pads and measuring a second voltage across the second interconnect via seventh and eight pads; and wherein the means for estimating the capacitance of the first interconnect or the capacitance mismatch between the first and second interconnects comprises:

means for electrically isolating the fifth through eighth pads from the second interconnect with a second set of isolation means located between the fifth through eighth pads from the second interconnect; and means for estimating the capacitance mismatch between the first and second interconnects by charging and discharging the first and second interconnects with the first through fourth pads electrically isolated by the first set of isolation means from the first interconnect and the fifth through eight pads electrically isolated by the second set of isolation means from the second interconnect.

19. The apparatus of claim 18, wherein the means for estimating the capacitance mismatch between the first and second interconnects comprises means for determining difference between first and second average currents for charging the first and second interconnects, respectively, means for determining frequency at which the first and second interconnects are charged and discharged, and means for estimating the capacitance mismatch between the first and second interconnects based on the difference between the first and second average currents and the frequency.

* * * * *